(12) United States Patent
Ptasienski et al.

(10) Patent No.: US 10,049,903 B2
(45) Date of Patent: Aug. 14, 2018

(54) METHOD OF MANUFACTURING A HIGH DEFINITION HEATER SYSTEM

(75) Inventors: Kevin Ptasienski, O'Fallon, MO (US); Allen Norman Boldt, Kirkwood, MO (US); Janet Lea Smith, Columbia, MO (US); Cal Thomas Swanson, St. Louis, MO (US); Mohammad Nosrati, Fenton, MO (US); Kevin Robert Smith, Columbia, MO (US)

(73) Assignee: Watlow Electric Manufacturing Company, St. Louis, MO (US)

( * ) Notice: Subject to any disclaimer, the term of this patent is extended or adjusted under 35 U.S.C. 154(b) by 113 days.

(21) Appl. No.: 13/599,781

(22) Filed: Aug. 30, 2012

(65) Prior Publication Data

US 2013/0228548 A1 Sep. 5, 2013

Related U.S. Application Data

(60) Provisional application No. 61/528,939, filed on Aug. 30, 2011, provisional application No. 61/635,310, filed on Apr. 19, 2012.

(51) Int. Cl.
*H01B 13/00* (2006.01)
*B44C 1/22* (2006.01)
(Continued)

(52) U.S. Cl.
CPC .. *H01L 21/67103* (2013.01); *H01L 21/67098* (2013.01); *H01L 21/67109* (2013.01); *H01L 21/67248* (2013.01); *H01L 21/6833* (2013.01); *H05B 1/00* (2013.01); *H05B 1/02* (2013.01); *H05B 1/0202* (2013.01); *H05B 1/0227* (2013.01); *H05B 1/0233* (2013.01);
(Continued)

(58) Field of Classification Search
CPC .................................................. H01L 21/6833
USPC ........................................................... 216/20
See application file for complete search history.

(56) References Cited

U.S. PATENT DOCUMENTS

| 3,752,956 A | 8/1973 | Cahill et al. |
|---|---|---|
| 6,392,205 B1 | 5/2002 | Minonishi |

(Continued)

FOREIGN PATENT DOCUMENTS

| CN | 1656193 | 8/2005 |
|---|---|---|
| CN | 101095212 | 12/2007 |

(Continued)

OTHER PUBLICATIONS

"Inconel", Wikiepedia (no date available).*
(Continued)

*Primary Examiner* — Thomas Pham
(74) *Attorney, Agent, or Firm* — Burris Law, PLLC

(57) ABSTRACT

Methods of manufacturing a heater are provided that generally include forming a laminate having a dielectric layer, a first double-sided adhesive dielectric layer, and a conductive layer. Next, a circuit pattern is created into the conductive layer, and then the circuit pattern is covered with a second double-sided adhesive dielectric layer. The second double-sided adhesive dielectric layer is covered with a sacrificial layer, and then the heater is formed, the heater comprising the dielectric layer, the first double-sided adhesive dielectric layer, the conductive layer, and the second double-sided adhesive dielectric layer. Subsequently, the sacrificial layer is removed.

12 Claims, 16 Drawing Sheets

(51) Int. Cl.
   *C03C 15/00*    (2006.01)
   *C03C 25/68*    (2006.01)
   *H01L 21/67*    (2006.01)
   *H05B 3/20*     (2006.01)
   *H05B 1/02*     (2006.01)
   *H05B 1/00*     (2006.01)
   *H05B 3/02*     (2006.01)
   *H01L 21/683*   (2006.01)
   *H05B 3/06*     (2006.01)

(52) U.S. Cl.
   CPC ............... *H05B 3/02* (2013.01); *H05B 3/06* (2013.01); *H05B 3/20* (2013.01); *H05B 2203/005* (2013.01); *H05B 2203/013* (2013.01); *H05B 2213/03* (2013.01); *Y10T 156/10* (2015.01)

(56) References Cited

U.S. PATENT DOCUMENTS

| | | | |
|---|---|---|---|
| 2003/0066826 A1 | 4/2003 | Lee et al. | |
| 2004/0232136 A1 | 11/2004 | Hisaii | |
| 2005/0145617 A1 | 7/2005 | McMillin et al. | |
| 2006/0144516 A1 | 7/2006 | Ricci et al. | |
| 2006/0289447 A1 | 12/2006 | Mohamed | |
| 2008/0011737 A1 | 1/2008 | Fukuoka | |
| 2008/0254392 A1* | 10/2008 | Yang | H05K 1/0346 430/311 |
| 2009/0059461 A1 | 3/2009 | Yonekura et al. | |
| 2010/0182386 A1* | 7/2010 | Alavizadeh et al. | 347/88 |
| 2011/0000426 A1* | 1/2011 | Herchen | H01L 21/67103 118/50 |
| 2011/0092072 A1* | 4/2011 | Singh et al. | 438/710 |
| 2012/0247641 A1* | 10/2012 | Ruggiero | H05B 3/26 156/60 |

FOREIGN PATENT DOCUMENTS

| | | |
|---|---|---|
| CN | 101269790 | 9/2008 |
| CN | 101662888 | 3/2010 |
| EP | 1303168 | 12/2001 |
| EP | 2203028 | 11/2009 |
| JP | H10-116887 | 5/1998 |
| JP | 2003258065 | 9/2003 |
| JP | 2001059694 | 3/2007 |
| JP | 2007329008 | 12/2007 |
| JP | 2008527694 | 7/2008 |
| JP | 2009054932 | 3/2009 |
| JP | 2010040644 | 2/2010 |
| WO | 2010061740 | 6/2012 |

OTHER PUBLICATIONS

International Search Report for PCT/US2012/053049; (dated Nov. 28, 2012).
International Search Report for PCT/US2012/053117; (dated Dec. 7, 2012).
International Search Report for PCT/US2012/053054; (dated Nov. 27, 2012).
International Search Report for PCT/US2012/053137; (dated Dec. 4, 2012).
International Search Report for PCT/US2012/053148; (dated Jan. 8, 2013).
International Search Report for PCT/US2012/053058; (dated Nov. 28, 2012).
International Search Report for PCT/US2012/053069; (dated Nov. 27, 2012).
International Search Report for PCT/US2012/053067; (dated Nov. 27, 2012).
Office Action and EnglishTranslation of JP Application No. 2014-528603 dated Aug. 30, 2016.

* cited by examiner

METHOD OF MANUFACTURING A HIGH DEFINITION HEATER SYSTEM

CROSS-REFERENCE TO RELATED APPLICATIONS

This application claims the benefit of provisional application Ser. Nos. 61/528,939 filed on Aug. 30, 2011 and 61/635,310 filed on Apr. 19, 2012, the contents of which are incorporated herein by reference in their entirety. This application is also related to co-pending applications titled "System and Method for Controlling a Thermal Array," and applications titled "Thermal Array System," concurrently filed herewith and commonly assigned with the present application, the contents of which are incorporated herein by reference in their entirety.

FIELD

The present disclosure relates to heater systems, and in particular, heater systems that can deliver a precise temperature profile to a heating target during operation in order to compensate for heat loss and/or other variations, in such applications as chucks or susceptors for use in semiconductor processing.

BACKGROUND

The statements in this section merely provide background information related to the present disclosure and may not constitute prior art.

In the art of semiconductor processing, for example, a chuck or susceptor is used to hold a substrate (or wafer) and to provide a uniform temperature profile to the substrate during processing. Referring to FIG. 1, a support assembly 10 for an electrostatic chuck is illustrated, which includes the electrostatic chuck 12 with an embedded electrode 14, and a heater plate 16 that is bonded to the electrostatic chuck 12 through an adhesive layer 18, which is typically a silicone adhesive. A heater 20 is secured to the heater plate 16, which may be an etched-foil heater, by way of example. This heater assembly is bonded to a cooling plate 22, again through an adhesive layer 24 that is typically a silicone adhesive. The substrate 26 is disposed on the electrostatic chuck 12, and the electrode 14 is connected to a voltage source (not shown) such that electrostatic power is generated, which holds the substrate 26 in place. A radio frequency (RF) or microwave power source (not shown) may be coupled to the electrostatic chuck 12 within a plasma reactor chamber that surrounds the support assembly 10. The heater 20 thus provides requisite heat to maintain temperature on the substrate 26 during various in-chamber plasma semiconductor processing steps, including plasma-enhanced film deposition or etch.

During all phases of processing of the substrate 26, it is important that the temperature profile of the electrostatic chuck 12 be tightly controlled in order to reduce processing variations within the substrate 26 being etched, while reducing total processing time. Improved devices and methods for improving temperature uniformity on the substrate are continually desired in the art of semiconductor processing, among other applications.

SUMMARY

In one form of the present disclosure, a method of manufacturing a heater is provided that comprises forming a laminate having a dielectric layer, a first double-sided adhesive dielectric layer, and a conductive layer, creating a circuit pattern into the conductive layer, covering the circuit pattern with a second double-sided adhesive dielectric layer, covering the second double-sided adhesive dielectric layer with a sacrificial layer, forming the heater comprising the dielectric layer, the first double-sided adhesive dielectric layer, the conductive layer, and the second double-sided adhesive dielectric layer, and subsequently removing the sacrificial layer.

In another method of manufacturing a heater, the method comprises forming a laminate having a first double-sided adhesive dielectric layer, a first sacrificial layer on one side of the double-sided adhesive dielectric layer, and a conductive layer on an opposite side of the double-sided adhesive dielectric layer, creating a circuit pattern into the conductive layer, covering the circuit pattern with a second double-sided adhesive dielectric layer, covering the double-sided adhesive dielectric layer with a second sacrificial layer, forming the heater comprising the first double-sided adhesive dielectric layer, the conductive layer, and the second double-sided adhesive dielectric layer, and subsequently removing at least one of the sacrificial layers.

In still another method of manufacturing a heater, the method comprises forming a laminate having a first double-sided adhesive dielectric layer, a first sacrificial layer on one side of the double-sided adhesive dielectric layer, and a conductive layer on an opposite side of the double-sided adhesive dielectric layer, creating a circuit pattern into the conductive material, covering the etched circuit pattern with a second double-sided adhesive dielectric material, covering the double-sided adhesive dielectric layer with a dielectric layer, forming the heater comprising the sacrificial layer, the first double-sided adhesive dielectric layer, the conductive layer, the second double-sided adhesive dielectric layer, and the dielectric layer, and subsequently removing the sacrificial layer.

In yet another method of manufacturing a heater, the method comprises forming a laminate having a first double-sided adhesive dielectric layer, a carrier layer on one side of the double-sided adhesive dielectric layer, and a conductive layer on an opposite side of the double-sided adhesive dielectric layer, creating a circuit pattern into the conductive layer, and joining the laminate to an adjacent component.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

The drawings described herein are for illustration purposes only and are not intended to limit the scope of the present disclosure in any way.

DETAILED DESCRIPTION

The following description is merely exemplary in nature and is not intended to limit the present disclosure, application, or uses. For example, the following forms of the present disclosure are directed to chucks for use in semiconductor processing, and in some instances, electrostatic chucks. However, it should be understood that the heaters and systems provided herein may be employed in a variety of applications and are not limited to semiconductor processing applications.

Figure 1:
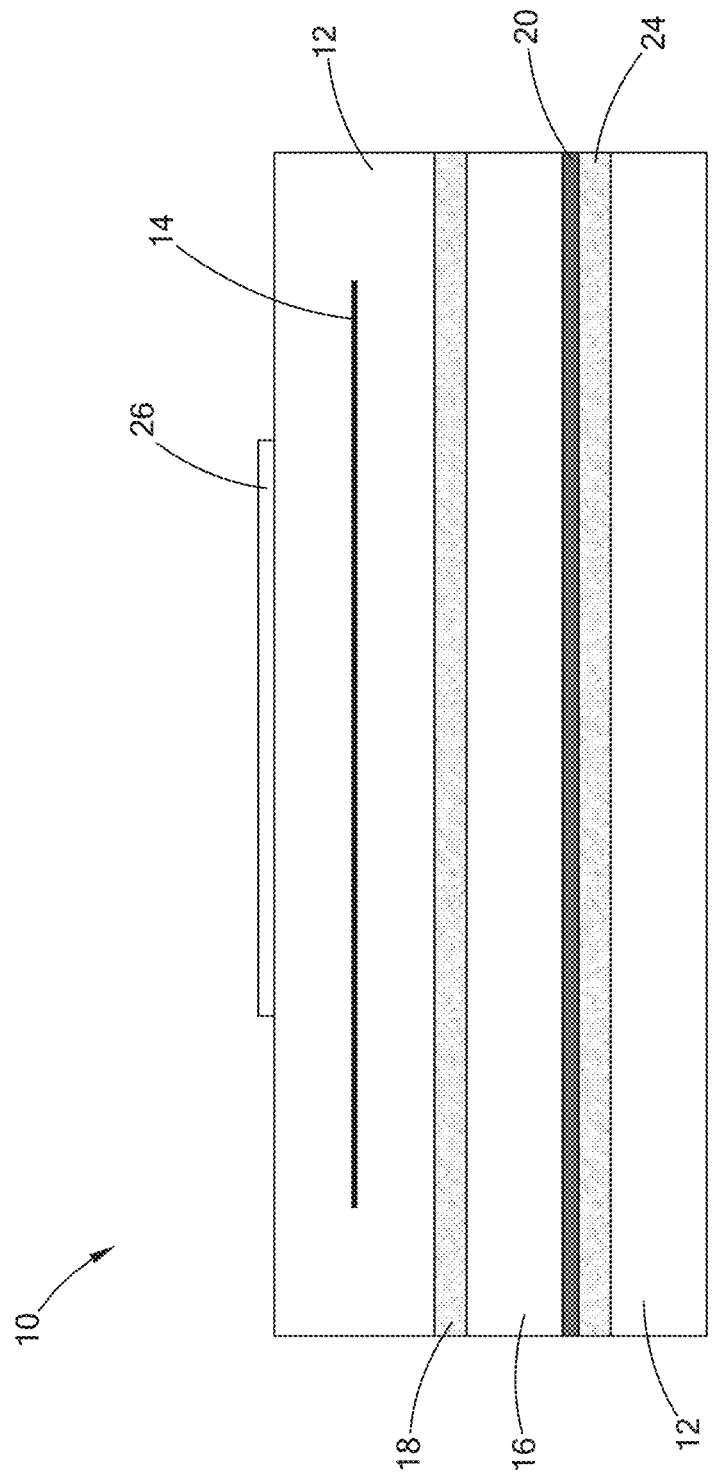
FIG. 1 is an elevated side view of a prior art electrostatic chuck.
Figure 2:
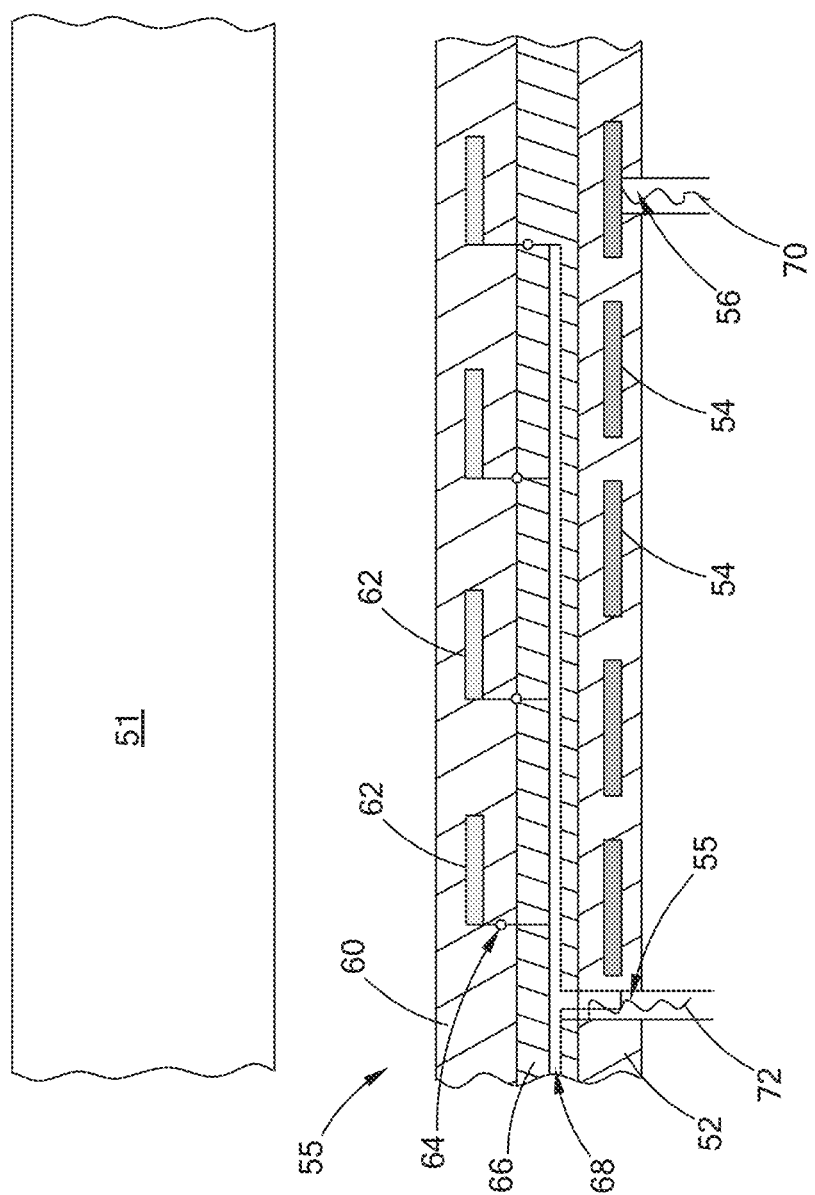
FIG. 2 is a partial side view of a heater having a tuning layer and constructed in accordance with the principles of one form of the present disclosure.

Referring to FIG. 2, one form of the present disclosure is a heater 50 that includes a base heater layer 52 having at least one heater circuit 54 embedded therein. The base heater layer 52 has at least one aperture 56 (or via) formed therethrough for connecting the heater circuit 54 to a power supply (not shown). The base heater layer 52 provides primary heating while a tuning heater layer 60 disposed proximate the heater layer 52 as shown provides for fine tuning of a heat distribution provided by the heater 50. The tuning layer 60 includes a plurality of individual heating elements 62 embedded therein, which are independently controlled. At least one aperture 64 is formed through the tuning layer 60 for connecting the plurality of individual heating elements 62 to the power supply and controller (not shown). As further shown, a routing layer 66 is disposed between the base heater layer 52 and the tuning layer 60 and defines an internal cavity 68. A first set of electrical leads 70 connects the heater circuit 54 to the power supply, which extend through the heater layer aperture 56. A second set of electrical leads 72 connects a plurality of heating elements 62 to the power supply and extend through the internal cavity 68 of the routing layer 66, in addition to the aperture 55 in the base heater layer 52. It should be understood that the routing layer 66 is optional, and the heater 50 could be employed without the routing layer 66 and instead having only the base heater layer 52 and the tuning heater layer 60.

In another form, rather than providing fine tuning of a heat distribution, the tuning layer 60 may alternately be used to measure temperature in the chuck 12. This form provides for a plurality of area-specific or discreet locations, of temperature dependent resistance circuits. Each of these temperature sensors can be individually read via a multiplexing switching arrangement, exemplary forms of which are set forth in greater detail below, that allows substantially more sensors to be used relative to the number of signal wires required to measure each individual sensor. The temperature sensing feedback can provide necessary information for control decisions, for instance, to control a specific zone of backside cooling gas pressure to regulate heat flux from the substrate 26 to the chuck 12. This same feedback can also be used to replace or augment temperature sensors installed near the base heater 50 for temperature control of base heating zones 54 or balancing plate cooling fluid temperature (not shown) via ancillary cool fluid heat exchangers.

In one form, the base heater layer 50 and the tuning heater layer 60 are formed from enclosing heater circuit 54 and tuning layer heating elements 62 in a polyimide material for medium temperature applications, which are generally below 250° C. Further, the polyimide material may be doped with materials in order to increase thermal conductivity.

In other forms, the base heater layer 50 and/or the tuning heater layer 60 are formed by a layered process, wherein the layer is formed through application or accumulation of a material to a substrate or another layer using processes associated with thick film, thin film, thermal spraying, or sol-gel, among others.

In one form, the base heating circuit 54 is formed from Inconel® and the tuning layer heating elements 62 are a Nickel material. In still another form, the tuning layer heating elements 62 are formed of a material having sufficient temperature coefficient of resistance such that the elements function as both heaters and temperature sensors, commonly referred to as "two-wire control." Such heaters and their materials are disclosed in U.S. Pat. No. 7,196,295 and pending U.S. patent application Ser. No. 11/475,534, which are commonly assigned with the present application and the disclosures of which are incorporated herein by reference in their entirety.

With the two-wire control, various forms of the present disclosure include temperature, power, and/or thermal impedance based control over the layer heating elements 62 through knowledge or measurement of voltage and/or current applied to each of the individual elements in the thermal impedance tuning layer 60, converted to electrical power and resistance through multiplication and division, corresponding in the first instance, identically to the heat flux output from each of these elements and in the second, a known relationship to the element temperature. Together these can be used to calculate and monitor the thermal impedance load on each element to allow an operator or control system to detect and compensate for area-specific thermal changes that may result from, but are not limited to, physical changes in the chamber or chuck due to use or maintenance, processing errors, and equipment degradation. Alternatively, each of the individually controlled heating elements in the thermal impedance tuning layer 60 can be assigned a setpoint resistance corresponding to the same or different specific temperatures which then modify or gate the heat flux originating from corresponding areas on a substrate through to the base heater layer 52 to control the substrate temperature during semiconductor processing.

In one form, the base heater 50 is bonded to a chuck 51, for example, by using a silicone adhesive or even a pressure sensitive adhesive. Therefore, the heater layer 52 provides primary heating, and the tuning layer 60 fine tunes, or adjusts, the heating profile such that a uniform or desired temperature profile is provided to the chuck 51, and thus the substrate (not shown).

In another form of the present disclosure, the coefficient of thermal expansion (CTE) of the tuning layer heating elements 62 is matched to the CTE of the tuning heating layer substrate 60 in order to improve thermal sensitivity of the tuning layer heating elements 62 when exposed to strain loads. Many suitable materials for two-wire control exhibit similar characteristics to Resistor Temperature Devices (RTDs), including resistance sensitivity to both temperature and strain. Matching the CTE of the tuning layer heating elements 62 to the tuning heater layer substrate 60 reduces strain on the actual heating element. And as the operating temperatures increase, strain levels tend to increase, and thus CTE matching becomes more of a factor. In one form, the tuning layer heating elements 62 are a high purity Nickel-Iron alloy having a CTE of approximately 15 ppm/° C., and the polyimide material that encloses it has a CTE of approximately 16 ppm/° C. In this form, materials that bond the tuning heater layer 60 to the other layers exhibit elastic characteristics that physically decouple the tuning heater layer 60 from other members of the chuck 12. It should be understood that other materials with comparable CTEs may also be employed while remaining within the scope of the present disclosure.

Figure 3:
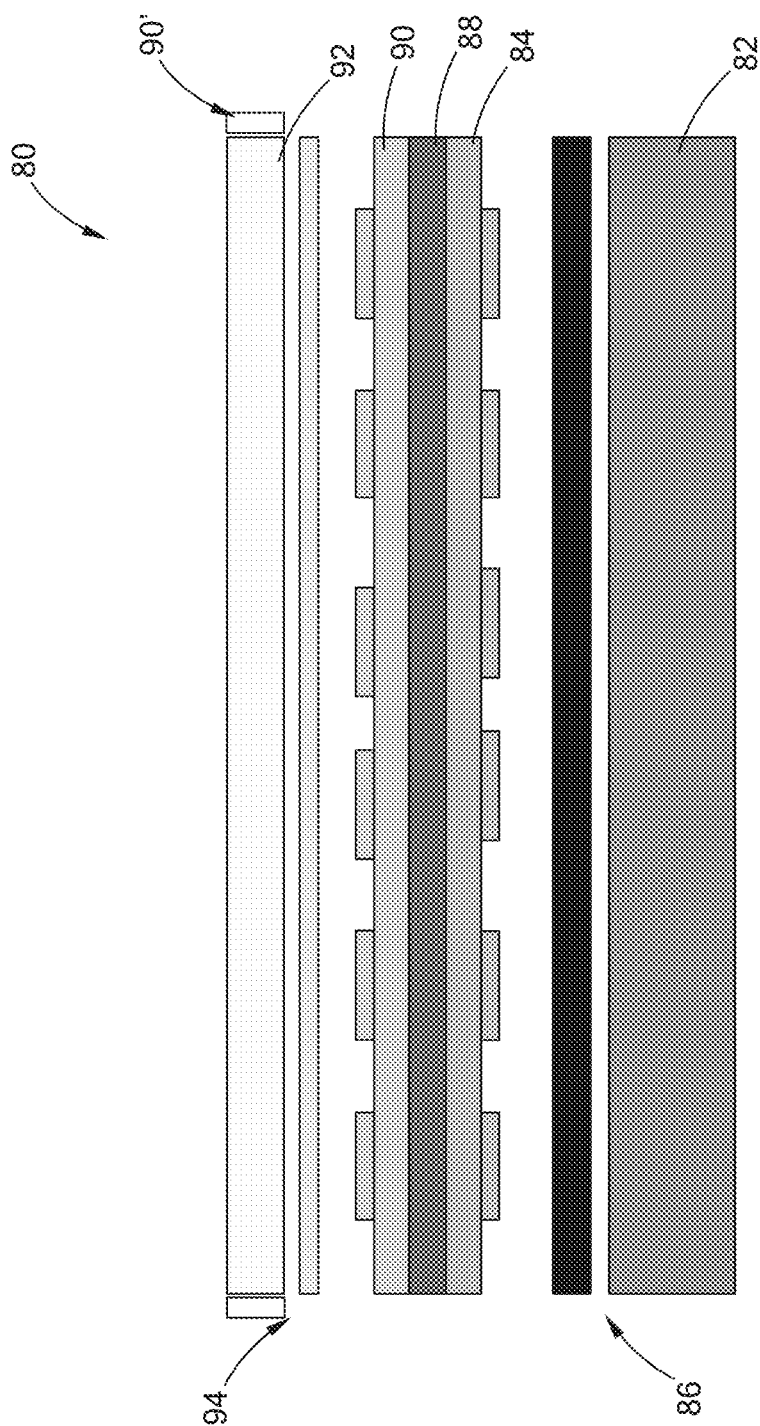
FIG. 3 is an exploded side view of another form of the heater of FIG. 1 having a tuning layer or tuning heater and constructed in accordance with the principles of the present disclosure.
Figure 4:
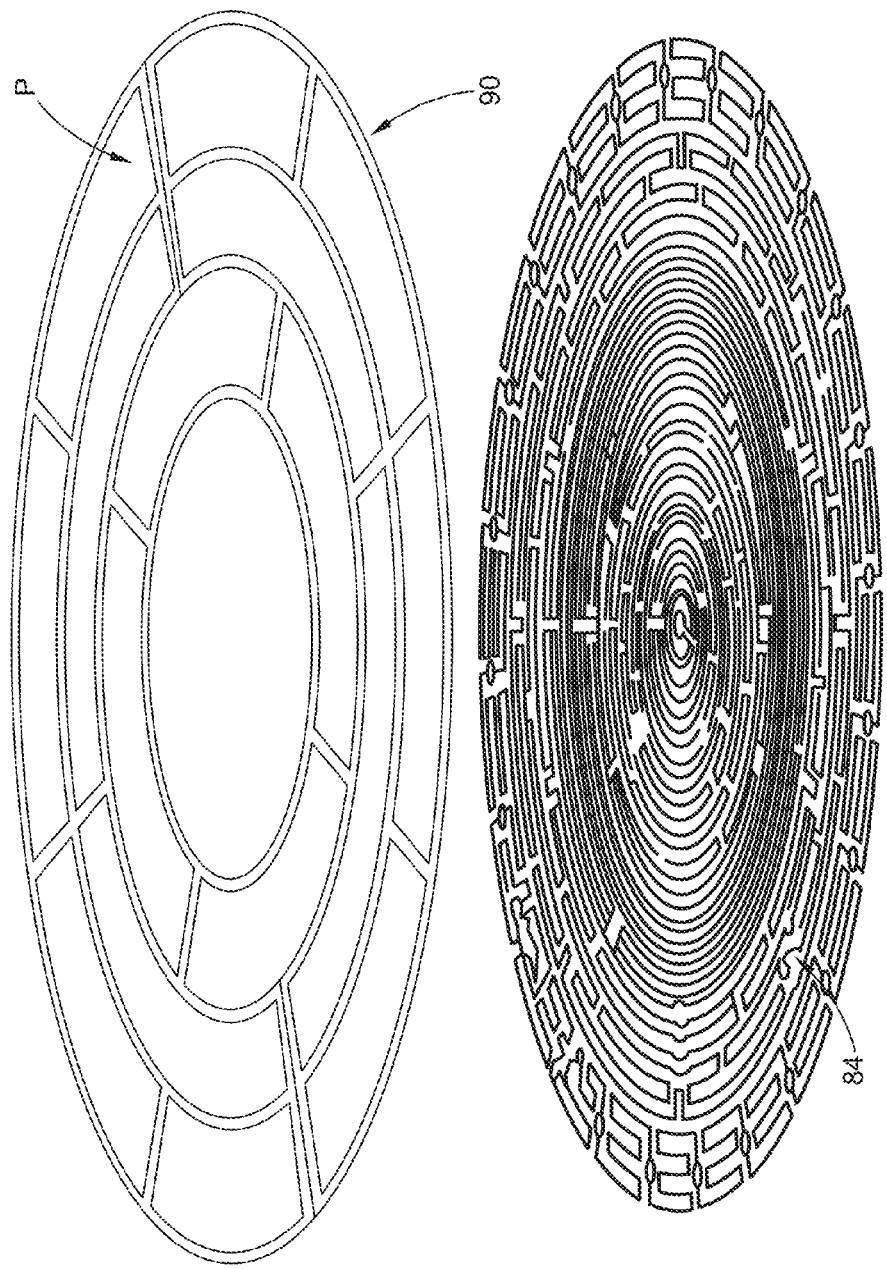
FIG. 4 is a perspective exploded view of the heater of FIG. 3, illustrating an exemplary four (4) zones for the base heater and eighteen (18) zones for the tuning heater in accordance with the principles of the present disclosure.
Figure 5:
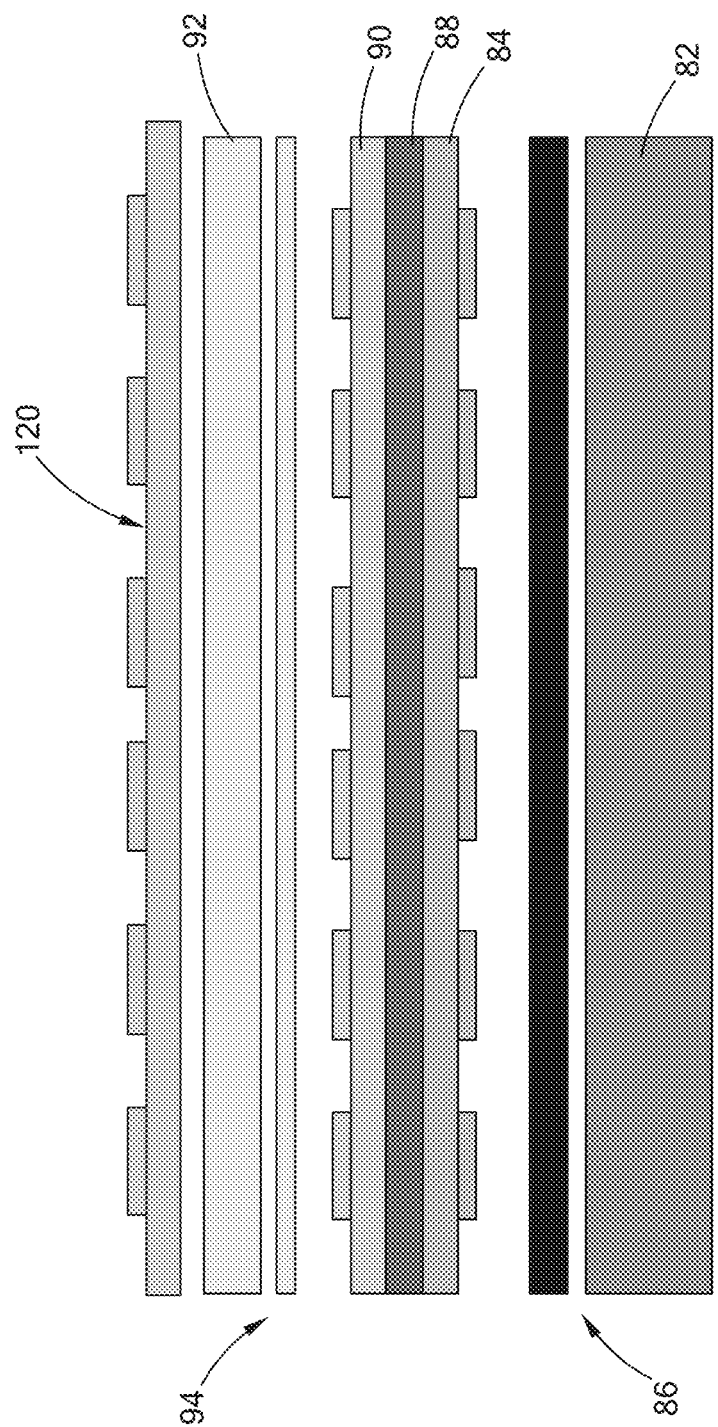
FIG. 5 is a side view of another form of a high definition heater system having a supplemental tuning layer and constructed in accordance with the principles of the present disclosure.

Referring now to FIGS. 3-5, one exemplary form of the heater having both a base heater layer and a tuning layer (as generally set forth above in FIG. 2) is illustrated and generally indicated by reference numeral 80. The heater 80 includes a base plate 82, (also referred to as a cooling plate), which in one form is an Aluminum plate approximately 16 mm in thickness. A base heater 84 is secured to the base plate 82, in one form using an elastomeric bond layer 86 as shown. The elastomeric bond may be one disclosed in U.S. Pat. No. 6,073,577, which is incorporated herein by reference in its entirety. A substrate 88 is disposed on top of the base heater 84 and is an Aluminum material approximately 1 mm in thickness according to one form of the present disclosure. The substrate 88 is designed to have a thermal conductivity to dissipate a requisite amount of power from the base heater 84. Because the base heater 84 has relatively high power, without a requisite amount of thermal conductivity, this base heater 84 would leave "witness" marks (from the resistive circuit trace) on adjacent components, thereby reducing the performance of the overall heater system.

A tuning heater 90 is disposed on top of the substrate 88 and is secured to a chuck 92 using an elastomeric bond layer 94, as set forth above. The chuck 92 in one form is an Aluminum Oxide material having a thickness of approximately 2.5 mm. It should be understood that the materials and dimensions as set forth herein are merely exemplary and thus the present disclosure is not limited to the specific forms as set forth herein. Additionally, the tuning heater 90 has lower power than the base heater 84, and as set forth above, the substrate 88 functions to dissipate power from the base heater 84 such that "witness" marks do not form on the tuning heater 90.

The base heater 84 and the tuning heater 90 are shown in greater detail in FIG. 4, in which an exemplary four (4) zones are shown for the base heater 84, and eighteen (18) zones for the tuning heater 90. In one form, the heater 80 is adapted for use with chuck sizes of 450 mm, however, the heater 80 may be employed with larger or smaller chuck sizes due to its ability to highly tailor the heat distribution. Additionally, the high definition heater 80 may be employed around a periphery (shown by area P) of the chuck (across a horizontal plane), or along a vertical location, FIG. 3, tuning layer 90', or in discrete predetermined locations across or along the chuck, or around the periphery other components or combinations of components, rather than in a stacked/planar configuration as illustrated herein. Further still, the high definition heater 80 may be employed in process kits, chamber walls, lids, gas lines, and showerheads, among other components within semiconductor processing equipment. It should also be understood that the heaters and control systems illustrated and described herein may be employed in any number of applications, and thus the exemplary semiconductor heater chuck application should not be construed as limiting the scope of the present disclosure.

The present disclosure also contemplates that the base heater 84 and the tuning heater 90 not be limited to a heating function. It should be understood that one or more of these members, referred to as a "base functional layer" and a "tuning layer," respectively, may alternately be a temperature sensor layer or other functional member while remaining within the scope of the present disclosure. Other functions may include, by way of example, a cooling layer or a diagnostic layer that would collect sensor input such as various electrical characteristics, among others.

As shown in FIG. 5, a dual tuning capability may be provided with the inclusion of a secondary tuning layer heater 120 on the top surface of the chuck 12. The secondary tuning layer may alternately be used as a temperature sensing layer rather than a heating layer while remaining within the scope of the present disclosure. Accordingly, any number of tuning layer heaters may be employed and should not be limited to those illustrated and described herein.

In another form, the base functional layer may include a plurality of thermoelectric elements rather than the base heater 84 construction as set forth above. These thermoelectric elements may also be arranged in zones and are generally disposed on top of, or proximate, the base plate or cooling plate 82.

Figure 6:
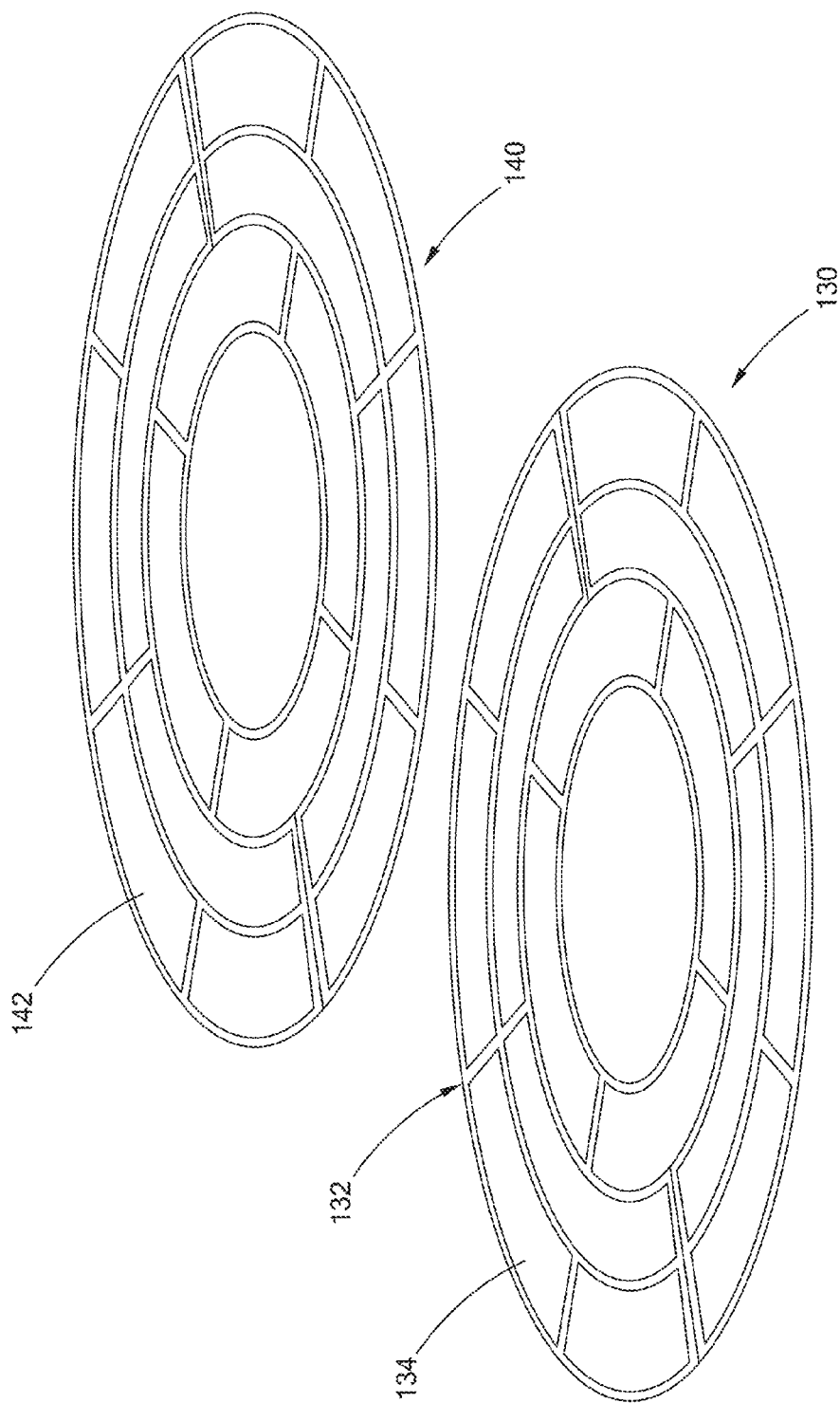
FIG. 6 is an exploded perspective view of alternating tuning layers that are offset from one another in accordance with another form of the present disclosure.

In still another form, the multiple tuning layers may be employed in a "stacked" configuration, or configured vertically such that individual resistive traces are offset from adjacent resistive traces on opposed layers to compensate for the gaps that exist between traces. For example, as shown in FIG. 6, a first tuning layer 130 is offset from a second tuning layer 140 such that the traces 142 of tuning layer 140 are aligned adjacent the gaps 132 between the traces 134 of the first tuning layer 130, and vice versa. In another form, a "checkerboard" design may be employed in order to compensate for gaps or hot spots between adjacent layers.

Figure 7:
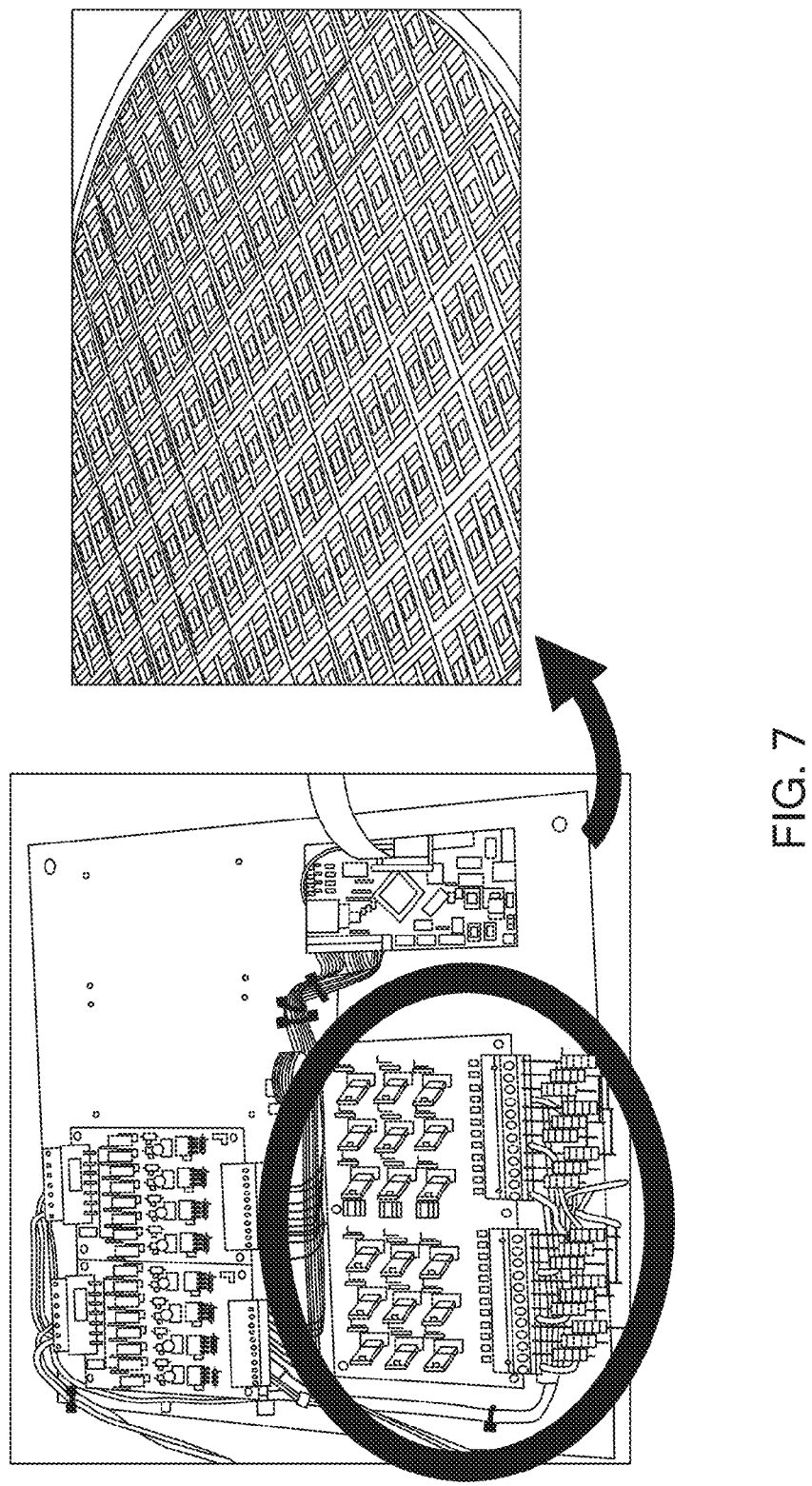
FIG. 7 is a perspective view of control devices that are embedded into layers of the heater chuck assembly in accordance with one form of the present disclosure.

Referring to FIG. 7, the threshold voltage switching circuits, which in one form comprise discrete solid state devices that electrically conduct in one direction when the voltage threshold across the circuit is exceeded and which, are embedded into or attached to the body of the heater chuck, which may be in a packaged form or generally embedded as bare die components. In another form, the control elements are embedded in the bond layer 86 as illustrated above. It should be understood that the control elements may be embedded within any of the components or assemblies thereof while remaining within the scope of the present disclosure. Alternately, the threshold voltage switching circuits on a single package silicon controls device (ASIC) may be embedded into or attached to the chuck in one form of the present disclosure. Additional controls devices may also be employed in order to provide redundancy should any of the components fail during operation.

In one form, the tuning layer 330 is a heater, and yet in another form, the tuning layer 330 is a temperature sensor, as set forth in detail above. This tuning layer 330, and also the base member 310, may be designed with a material having sufficient TCR characteristics such that they function as both a heater and as a temperature sensor. Additionally, a secondary tuning layer (shown in FIG. 5) is secured to a top surface of the component 340, and it should also be understood that any number of tuning layers, functioning as heaters and/or temperature sensors, may be employed while remaining within the scope of the present disclosure. With the secondary tuning layer secured to the top surface of the component 340, the wafer would be supported indirectly, versus directly when the wafer is on the top surface of the component 340.

The apparatus 300 may also employ the routing layer 66 as shown in FIG. 2 in order to accommodate a number of power lines. Additional features as set forth herein throughout the figures may also be employed with this form of the present disclosure having a base member 310 with fluid passageways 320 while remaining within the scope of the present disclosure.

Referring to FIGS. 8-12, another form of the present disclosure includes methods of manufacturing a heater, for example both the base heater 84 as well as the tuning heater 90 as set forth above.

Figure 8:
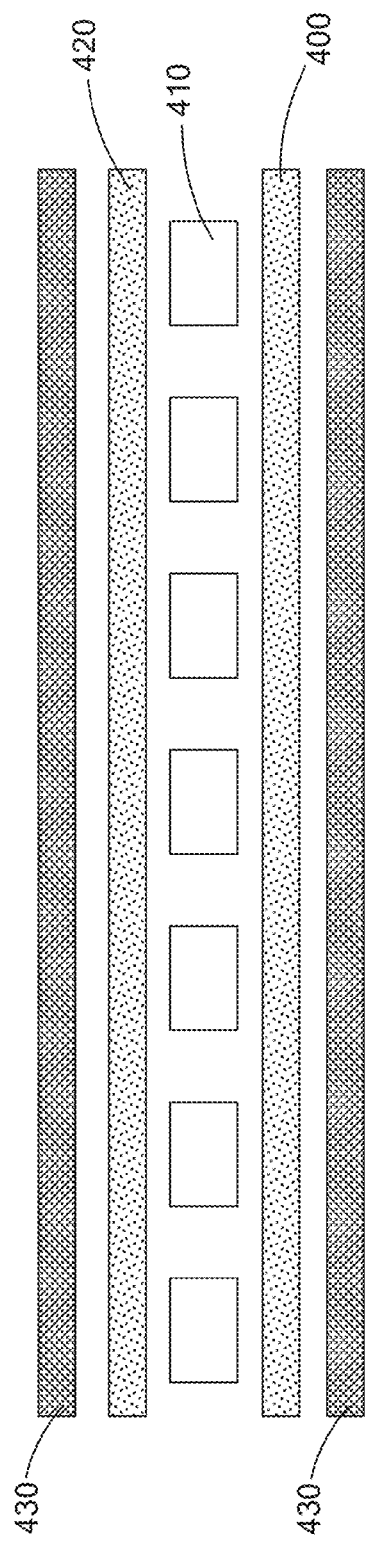
FIG. 8 is a cross-sectional view illustrating a heater manufactured according to a prior art method.
Figure 9:
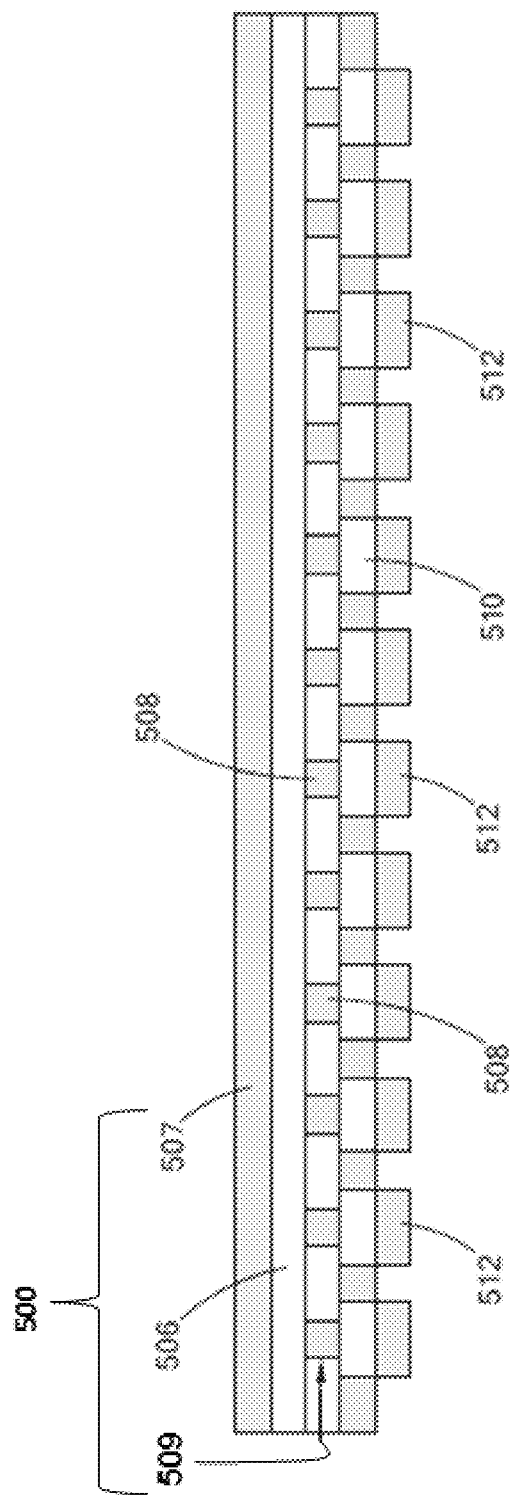
FIG. 9 is a cross-sectional view illustrating a method of manufacturing a heater in accordance with one form of the present disclosure.

By way of background, and with reference to FIG. 8, when the base heater 84, for example, is a polyimide heater, its construction includes a double-sided adhesive dielectric layer 400, a conductive layer 410, in which a circuit pattern is formed, and another double-sided adhesive dielectric layer 420. The double-sided adhesive layers 400 and 420 are not available with adhesive on one side only, and as such, in prior art methods, yet additional dielectric layers 430 (not having any adhesive) are placed over the double-sided adhesive layers 400 and 420 in order to create the final heater. However, these additional dielectric layers 430 have relatively low thermal conductivity and thus acts as a thermal "choke" when transferring heat during operation of the chuck. And as additional layers, such as additional heating layers and/or sensors are added to the overall stack, the thermal choke becomes worse.

The methods according to the present disclosure are illustrated in FIGS. 9-12 and generally include a layer laminate 500 in which the previously employed dielectric layers 430 are replaced with sacrificial layers or in some cases a carrier layer during manufacture of the tuning heater. More specifically, with reference to FIG. 9, the method comprises forming the laminate 500 having a first double-sided adhesive dielectric layer 506, a first sacrificial layer 507 on one side of the double-sided adhesive dielectric layer 506, and a conductive layer 509 on an opposite side of the double-sided adhesive dielectric layer 506. Next, a circuit pattern 508 is created into the conductive layer 509, for example by way of an etching process, and the circuit pattern 508 is then covered with a second double-sided adhesive dielectric layer 510. The double-sided adhesive dielectric layer 510 is covered with a second sacrificial layer 512.

The heater is then formed, for example by a press operation, wherein the heater itself comprises the first double-sided adhesive dielectric layer 506, the conductive layer 508, and the second double-sided adhesive dielectric layer 510. After the heater is formed, at least one of the sacrificial layers 507 and 512 is removed. Accordingly, by using the sacrificial layers 507 and 512, the need for the previous dielectric layers is eliminated and the heater can transfer heat more efficiently.

Figure 10:
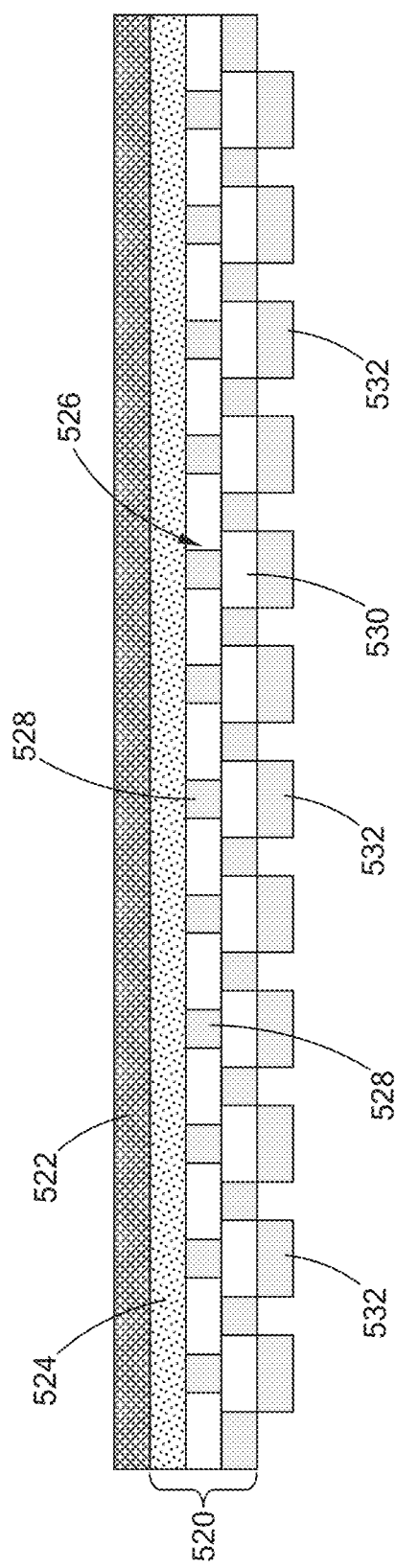
FIG. 10 is a cross-sectional view illustrating another method of manufacturing a heater in accordance with another form of the present disclosure.

Another variation of this method is illustrated in FIG. 10, wherein the method comprises forming a laminate 520 having a dielectric layer 522, a first double-sided adhesive dielectric layer 524, and a conductive layer 526. A circuit pattern 528 is created into the conductive layer 526, and the circuit pattern 528 is then covered with a second double-sided adhesive dielectric layer 530. The second double-sided adhesive dielectric layer 530 is covered with a sacrificial layer 532, and then the heater is formed, for example by a press operation. The heater comprises the dielectric layer 522, the first double-sided adhesive dielectric layer 524, the conductive layer 526, and the second double-sided adhesive dielectric layer 530. After the heater is formed, the sacrificial layer 532 is removed.

Figure 11:
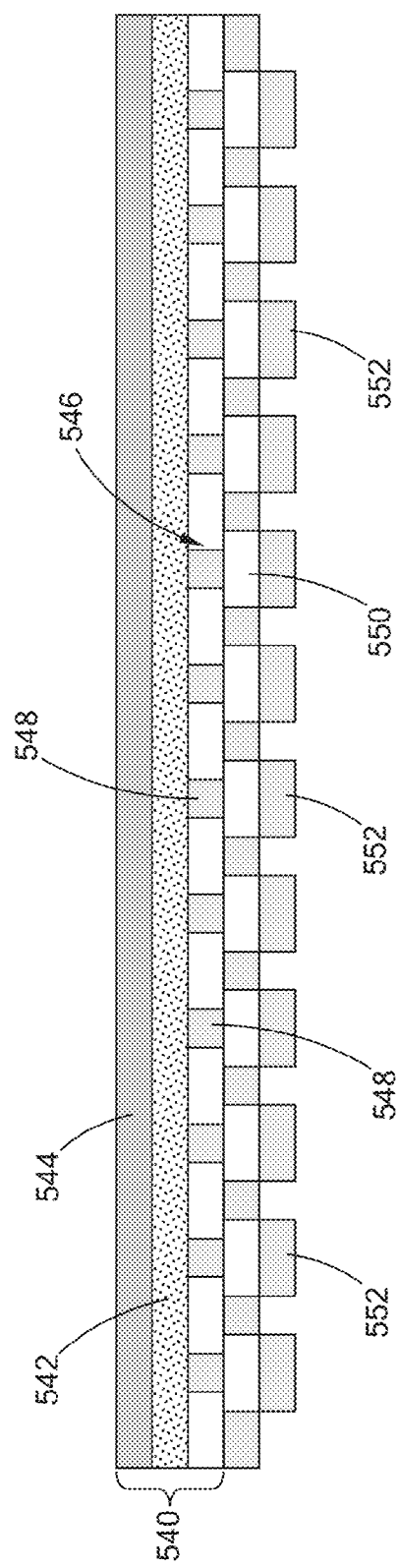
FIG. 11 is a cross-sectional view illustrating yet another method of manufacturing a heater in accordance with another form of the present disclosure.

Yet another variation of the methods above is shown in FIG. 11, wherein the method comprises forming a laminate 540 having a first double-sided adhesive dielectric layer 542, a first sacrificial layer 544 on one side of the double-sided adhesive dielectric layer 542, and a conductive layer 546 on an opposite side of the double-sided adhesive dielectric layer 542. Next, a circuit pattern 548 is created into the conductive layer 546, for example by way of an etching process, and the circuit pattern 548 is covered with a second double-sided adhesive dielectric material 550. The double-sided adhesive dielectric layer 550 is then covered with a dielectric layer 552. The heater is formed, for example by a press operation, wherein the heater comprises the sacrificial layer 544, the first double-sided adhesive dielectric layer 542, the conductive layer 546, the second double-sided adhesive dielectric layer 550, and the dielectric layer 552. After the heater is formed, the sacrificial layer 544 is removed.

Figure 12:
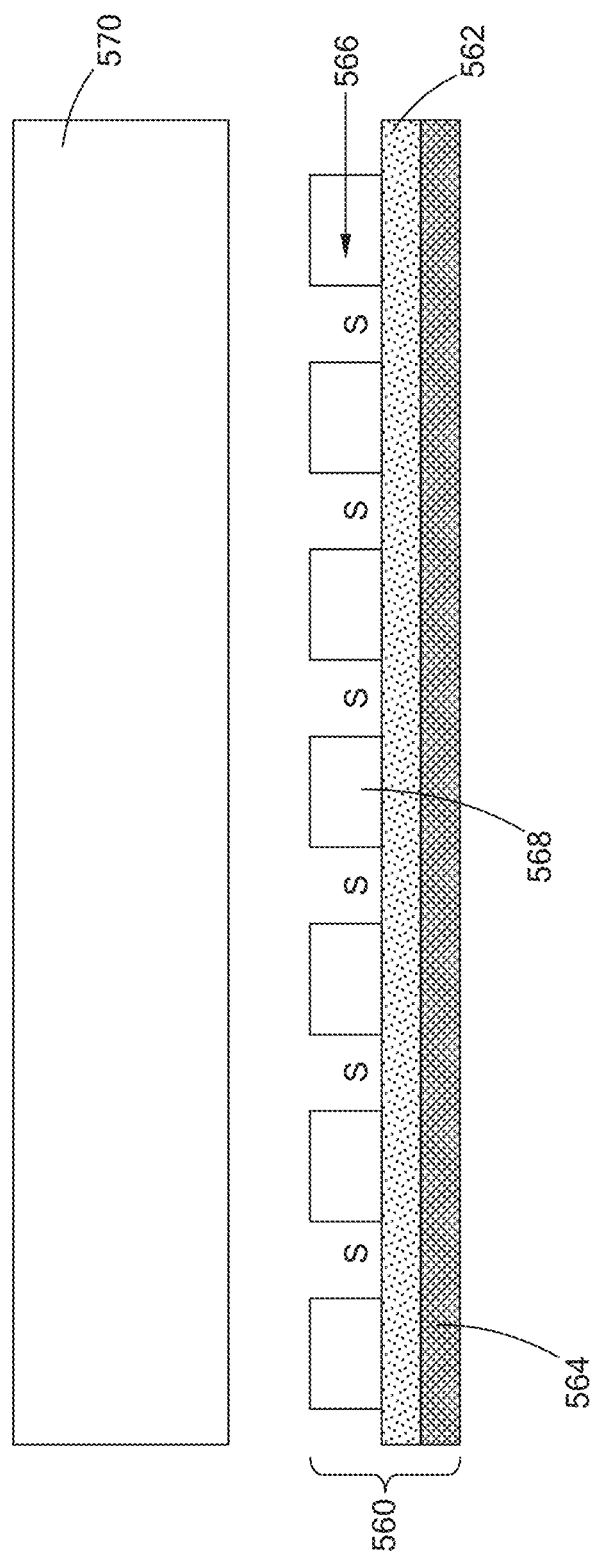
FIG. 12 is a cross-sectional view illustrating still another method of manufacturing a heater in accordance with another form of the present disclosure.

Still another variation of the methods according to the present disclosure is shown in FIG. 12, wherein the method comprises forming a laminate 560 having a first double-sided adhesive dielectric layer 562, a carrier layer 564 on one side of the double-sided adhesive dielectric layer 562, and a conductive layer 566 on an opposite side of the double-sided adhesive dielectric layer 562. A circuit pattern 568 is created into the conductive layer 566, and then the laminate 560 is joined to an adjacent component 570, such as a chuck by way of example. The carrier layer 564 can be removed before joining the laminate 560 to the adjacent component 570, or the carrier layer 564 can be removed after joining the laminate 560 to the adjacent component 570. Additionally, before the laminate 560 is joined to the adjacent component 570, the double-sided adhesive dielectric layer 562 and the carrier layer 564 can be deformed into spaces "S" between the circuit pattern 568 in order to create a more flat laminate 560.

The conductive layer 508 is an Inconel® material in one form of the present disclosure and may generally be one of a variety of Nickel alloys. The double-sided adhesive dielectric layers 506 and 510 are a polyimide material in one form of the present disclosure. In one form, each of the conductive layer 508 and the dielectric layers 506 and 510 define a thickness between about 0.025 mm and about 0.050 mm, and the sacrificial layer 502 defines a thickness of about 0.017 mm. Additionally, a cleaning operation, such as a light pumice scrub, may be employed after removing the sacrificial layers 507 and/or 512.

The sacrificial layers are Copper in one form of the present disclosure and are generally removed by an etching process. In another form, the sacrificial layers may be Aluminum and partially ground down to create a flat surface for wafer processing. Accordingly, some of the layer would remain with the heater or laminate stack and not be entirely removed. It should also be understood that the various sacrificial and carrier layers may be entirely removed or remain with the heater during subsequent operations while remaining within the scope of the present disclosure.

Figure 13:
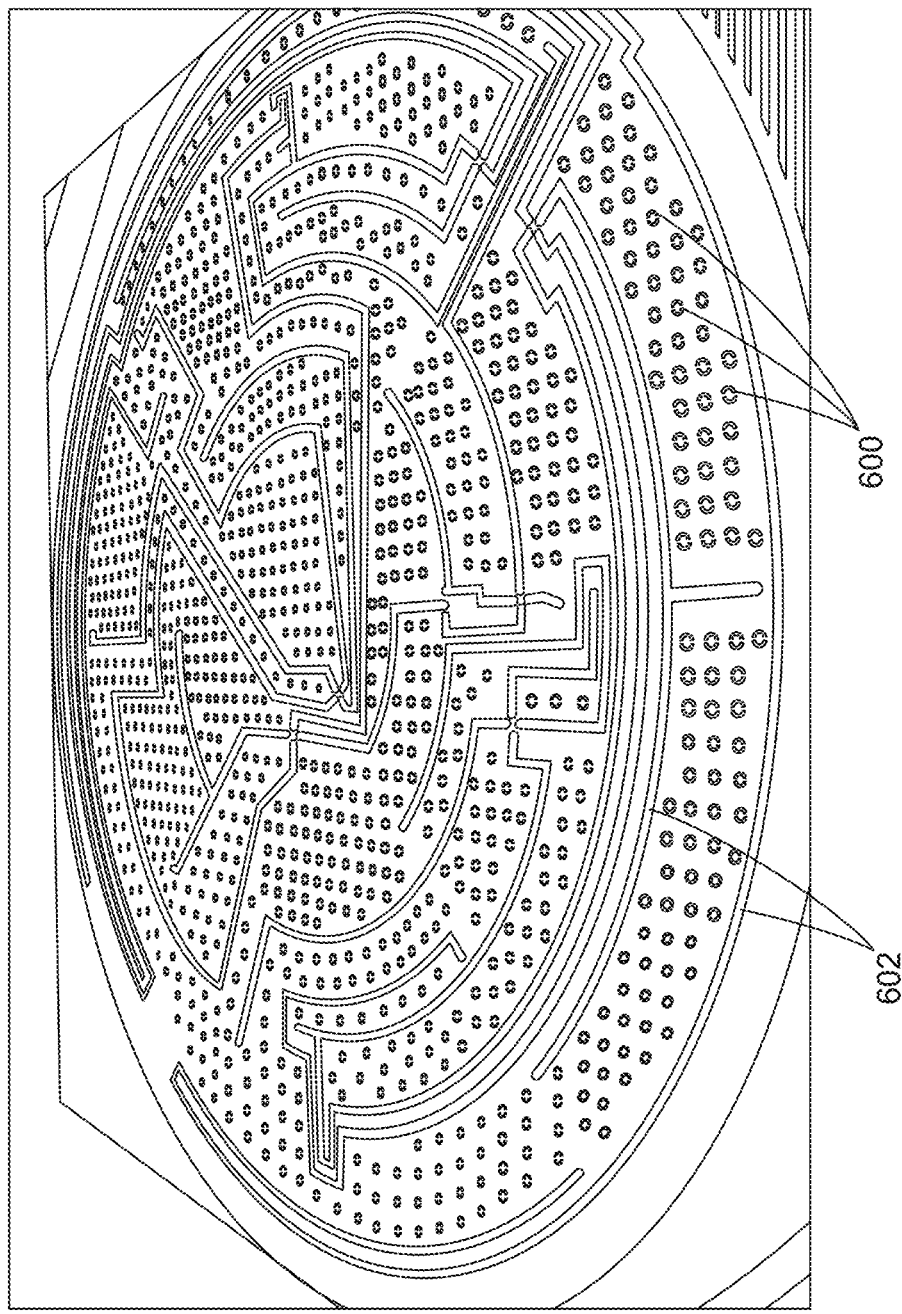
FIG. 13 is a perspective view illustrated a plurality of support elements constructed in accordance with another form of the present disclosure.
Figure 14:
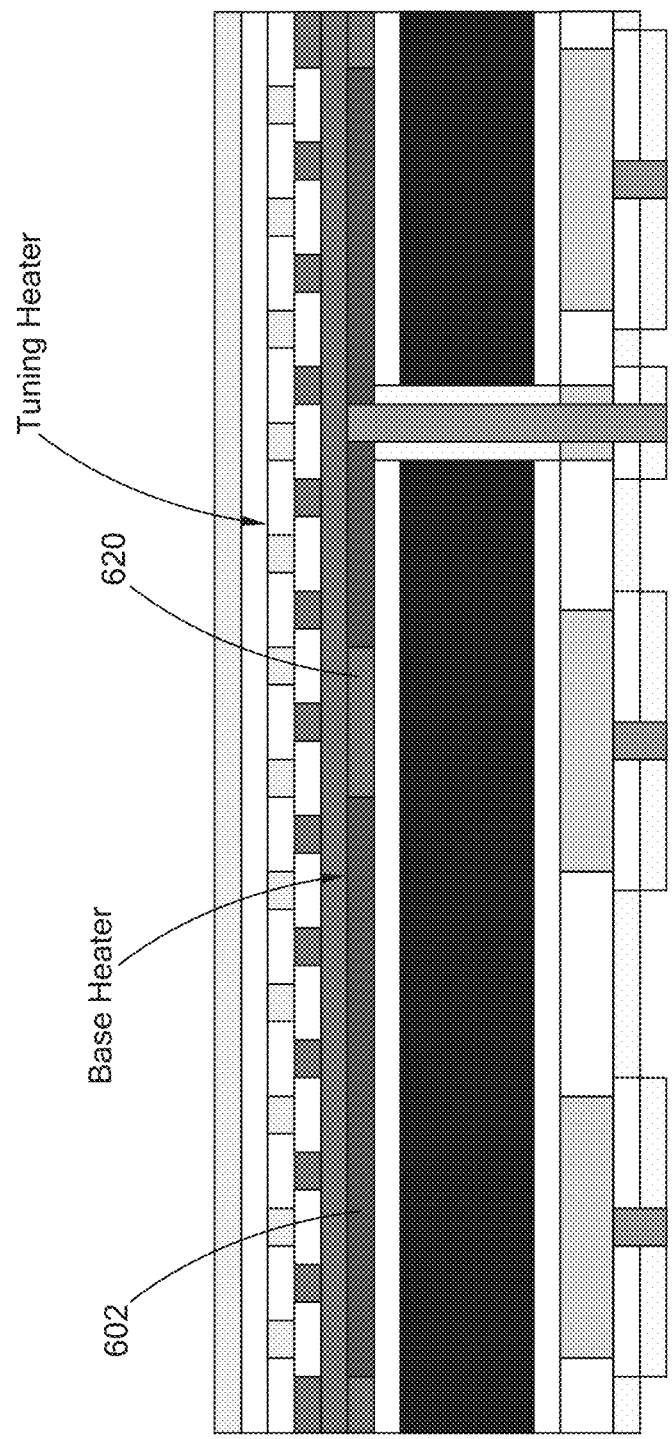
FIG. 14 is a cross-sectional view illustrating the support elements in accordance with the teachings of the present disclosure.
Figure 15:
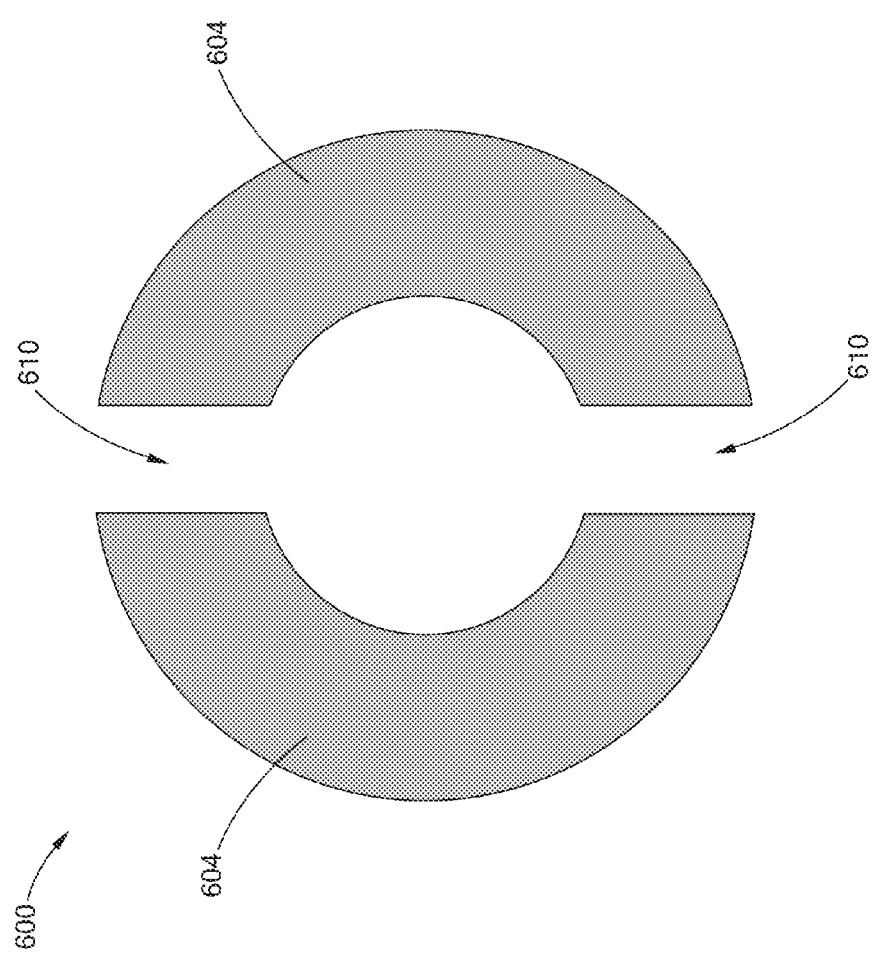
FIG. 15 is an enlarged plan view of a support element in accordance with the teachings of the present disclosure.

Referring now to FIGS. 13-15, another form of the present disclosure includes a plurality of support elements 600 are provided between the tuning heater layer and the boost heater layer in order to provide the requisite flatness during manufacture, which in this form is a press process. More specifically, in this form of the present disclosure, the support elements 600 are etched into a copper layer 602 having a heater circuit. As shown in FIG. 13, relatively large space is present between traces in the copper layer 602, which is somewhat of a void that contributes to a non-flat laminate, or a laminate that has an undesirable flatness. By providing support elements 600, additional structure is provided in order to improve flatness. And as shown in FIG. 15, the support elements 600 are in a "split" configuration, or are comprised of two portions 602 and 604 having an opening 610 therebetween. As such, the adhesive 620 (shown in FIG. 14) is allowed to flow more evenly between each of the support elements 600.

Figure 16:
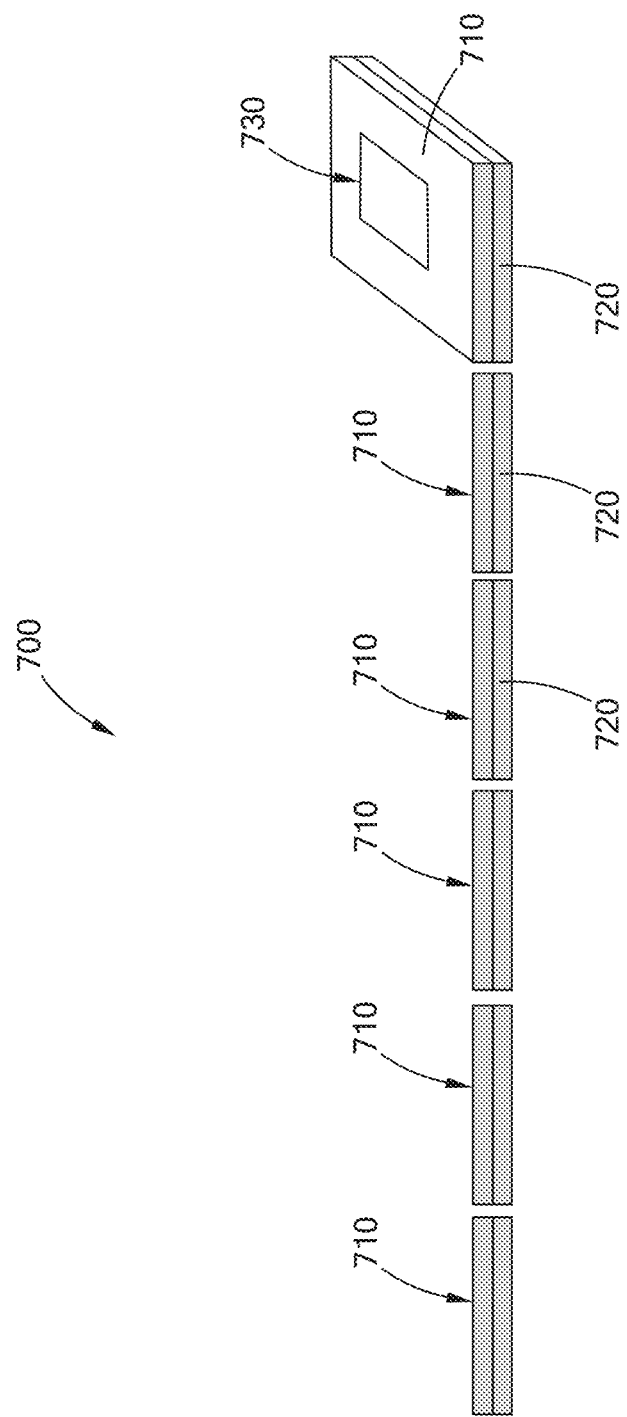
FIG. 16 is a perspective view illustrating heat spreaders constructed in accordance with the teachings of the present disclosure.

As shown in FIG. 16, another form of the tuning heater 700 is illustrated, wherein a corresponding plurality of heat spreaders 710 are disposed on each of the elements 720 to provide temperature uniformity across the individual elements 720. The heat spreaders can be a variety of materials, including but not limited to, Aluminum, Copper, and Pyrolytic Graphite, including PGS (Pyrolytic Graphite Sheet). In one form, the heat spreaders 710 are a monolithic and constant thickness configuration as shown. However, it should be understood that other configurations, including integral grooves, or heat guides, 730 may also be provided while remaining within the scope of the present disclosure.

Each of the tuning layers/heaters set forth herein are controlled by a control system, various forms of which are set forth in greater detail in co-pending applications titled "System and Method for Controlling a Thermal Array," and applications titled "Thermal Array System," concurrently filed herewith and commonly assigned with the present application. Generally, the control systems have a plurality of sets of power lines in communication with the tuning layer and a plurality of addressable control elements in electrical communication with the power lines and with the tuning layer, the control elements providing selective control of the tuning layer zones. The control elements may be, by way of example, threshold voltage switching circuits, which may be semiconductor switches. The threshold voltage switching circuits may be packaged, for example in an ASIC (Application Specific Integrated Circuit). Furthermore, the control elements may be embedded within the component, such as the chuck, as set forth above. These control systems and their related algorithms are described and illustrated in greater detail in the co-pending applications set forth above and thus are not included herein for purposes of clarity.

It should be noted that the disclosure is not limited to the embodiments described and illustrated as examples. A large variety of modifications have been described and more are part of the knowledge of the person skilled in the art. These and further modifications as well as any replacement by technical equivalents may be added to the description and figures, without leaving the scope of the protection of the disclosure and of the present patent.

What is claimed is:

1. A method of manufacturing a heater comprising:
   forming a first laminate having a dielectric layer, a first double-sided adhesive dielectric layer, and a conductive layer;
   creating a circuit pattern into the conductive layer;
   covering the circuit pattern with a second double-sided adhesive dielectric layer;
   covering the second double-sided adhesive dielectric layer with a sacrificial layer to form a second laminate comprising the dielectric layer, the first double-sided adhesive dielectric layer, the circuit pattern, the second double-sided adhesive dielectric layer, and the sacrificial layer, wherein the circuit pattern and the sacrificial layer are disposed on opposing surfaces of the second double-sided adhesive dielectric layer, the sacrificial layer overlapping the circuit pattern;
   pressing the second laminate that comprises the dielectric layer, the first double-sided adhesive dielectric layer, the circuit pattern, the second double-sided adhesive layer, and the sacrificial layer; and
   subsequently removing the sacrificial layer after the pressing to form a heater comprising the dielectric layer, the first double-sided adhesive dielectric layer, the circuit pattern, and the second double-sided adhesive dielectric layer.

2. The method according to claim 1, wherein the sacrificial layer is a copper material.

3. The method according to claim 1, wherein the conductive layer is formed of a Nickel alloy material.

4. The method according to claim 1, wherein the double-sided adhesive dielectric layers are formed of a polyimide material.

5. The method according to claim 1, wherein each of the conductive layer and the dielectric layers each define a thickness between about 0.025 mm and about 0.050 mm.

6. The method according to claim 1, wherein the circuit pattern is created by an etching process.

7. A method of manufacturing a heater, the method comprising:
   forming a first laminate having a first double-sided adhesive dielectric layer, a first sacrificial layer on one side of the first double-sided adhesive dielectric layer, and a conductive layer on an opposite side of the first double-sided adhesive dielectric layer;
   creating a circuit pattern into the conductive layer;
   covering the circuit pattern with a second double-sided adhesive dielectric layer;
   covering the second double-sided adhesive dielectric layer with a second sacrificial layer to form a second laminate comprising the first double-sided adhesive dielectric layer, the first sacrificial layer, the circuit pattern, the second double-sided adhesive dielectric layer, and the second sacrificial layer, wherein the circuit pattern and the second sacrificial layer are disposed on opposing surfaces of the second double-sided adhesive dielectric layer, the second sacrificial layer overlapping the circuit pattern;

pressing the second laminate that comprises the first double-sided adhesive dielectric layer, the first sacrificial layer, the circuit pattern, the second double-sided adhesive dielectric layer, and the second sacrificial layer; and subsequently removing at least one of the first and second sacrificial layers after the pressing to form a heater comprising the first double-sided adhesive dielectric layer, the circuit pattern, the second double-sided adhesive dielectric layer, and at most one of the first and the second sacrificial layers.

8. The method according to claim 7, wherein the sacrificial layers are a copper material.

9. The method according to claim 7, wherein the double-sided adhesive dielectric layers are formed of a polyimide material.

10. The method according to claim 7, wherein the conductive layer is formed of a Nickel alloy material.

11. The method according to claim 7, wherein each of the conductive layer and the double-sided adhesive dielectric layers each define a thickness between about 0.025 mm and about 0.050 mm.

12. The method according to claim 7, wherein the circuit pattern is created by an etching process.

* * * * *